(12) United States Patent  
Kato

(10) Patent No.: US 9,960,122 B2
(45) Date of Patent: May 1, 2018

(54) COMPOSITE DEVICE WITH SUBSTRATE AND MOUNTED COMPONENT

(71) Applicant: Murata Manufacturing Co., Ltd., Nagaokakyo-shi, Kyoto-fu (JP)

(72) Inventor: Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days. days.

(21) Appl. No.: 15/464,393

(22) Filed: Mar. 21, 2017

(65) Prior Publication Data

US 2017/0194263 A1    Jul. 6, 2017

Related U.S. Application Data

(63) Continuation of application No. PCT/JP2015/078717, filed on Oct. 9, 2015.

(30) Foreign Application Priority Data

Oct. 16, 2014  (JP) .................................. 2014-211502

(51) Int. Cl.
*H01L 23/538* (2006.01)
*H01L 23/14* (2006.01)
(Continued)

(52) U.S. Cl.
CPC ........ *H01L 23/5389* (2013.01); *H01L 23/145* (2013.01); *H01L 23/3121* (2013.01);
(Continued)

(58) Field of Classification Search
CPC ............. H01L 23/5389; H01L 23/5387; H01L 23/3121; H01L 23/145; H01L 23/5386;
(Continued)

(56) References Cited

U.S. PATENT DOCUMENTS 7,549,220 B2 *  6/2009  Roseen, Jr. .......... H05K 3/0011
                                               156/272.2
8,217,272 B2 *  7/2012  Choudhury ......... H01L 23/3677
                                               174/250
(Continued)

FOREIGN PATENT DOCUMENTS

JP    2003-298234 A    10/2003
JP    2008-288433 A    11/2008
(Continued)

OTHER PUBLICATIONS

Official Communication issued in International Patent Application No. PCT/JP2015/078717, dated Jan. 12, 2016.

*Primary Examiner* — William Coleman
(74) *Attorney, Agent, or Firm* — Keating & Bennett, LLP

(57) ABSTRACT

A composite device includes a substrate and a mounted component mounted on a surface of, or inside, the substrate. The substrate includes a first thermoplastic resin layer. A surface of the mounted component includes a second thermoplastic resin layer that includes a same or a similar material as that of the first thermoplastic resin layer. A bonding layer that bonds the second thermoplastic resin layer and the first thermoplastic resin layer together is provided between the second thermoplastic resin layer and the first thermoplastic resin layer.

20 Claims, 16 Drawing Sheets

(51) Int. Cl.
  *H01L 23/66* (2006.01)
  *H03H 7/38* (2006.01)
  *H01L 23/00* (2006.01)
  *H01L 23/31* (2006.01)
  *H01L 25/065* (2006.01)

(52) U.S. Cl.
  CPC ...... *H01L 23/5383* (2013.01); *H01L 23/5385* (2013.01); *H01L 23/5386* (2013.01); *H01L 23/5387* (2013.01); *H01L 23/66* (2013.01); *H01L 24/17* (2013.01); *H01L 25/0652* (2013.01); *H03H 7/38* (2013.01); *H01L 2223/6677* (2013.01); *H01L 2224/16227* (2013.01); *H01L 2224/16503* (2013.01); *H01L 2924/1421* (2013.01); *H01L 2924/19102* (2013.01)

(58) Field of Classification Search
  CPC ..... H01L 23/5385; H01L 23/66; H01L 24/17; H01L 25/0652; H03H 7/38
  See application file for complete search history.

(56) References Cited

U.S. PATENT DOCUMENTS

| | | | |
|---|---|---|---|
| 9,209,151 B2 * | 12/2015 | Chauhan | ................ H01L 24/26 |
| 2011/0266666 A1 | 11/2011 | Maeda et al. | |
| 2013/0002404 A1 | 1/2013 | Takeoka et al. | |
| 2014/0003011 A1 | 1/2014 | Kato et al. | |
| 2014/0030471 A1 | 1/2014 | Otsubo | |
| 2014/0356055 A1 | 12/2014 | Nakano et al. | |
| 2015/0036305 A1 | 2/2015 | Nanjo | |
| 2016/0260685 A1 * | 9/2016 | Tremlett | ............. H01L 25/0652 |

FOREIGN PATENT DOCUMENTS

| | | |
|---|---|---|
| JP | 2009-289802 A | 12/2009 |
| JP | 2011-228631 A | 11/2011 |
| JP | 5583828 B1 | 9/2014 |
| WO | 2012/020748 A1 | 2/2001 |
| WO | 2012/120995 A1 | 9/2012 |
| WO | 2012/137626 A1 | 10/2012 |
| WO | 2013/132942 A1 | 9/2013 |
| WO | 2013/168539 A1 | 11/2013 |

\* cited by examiner

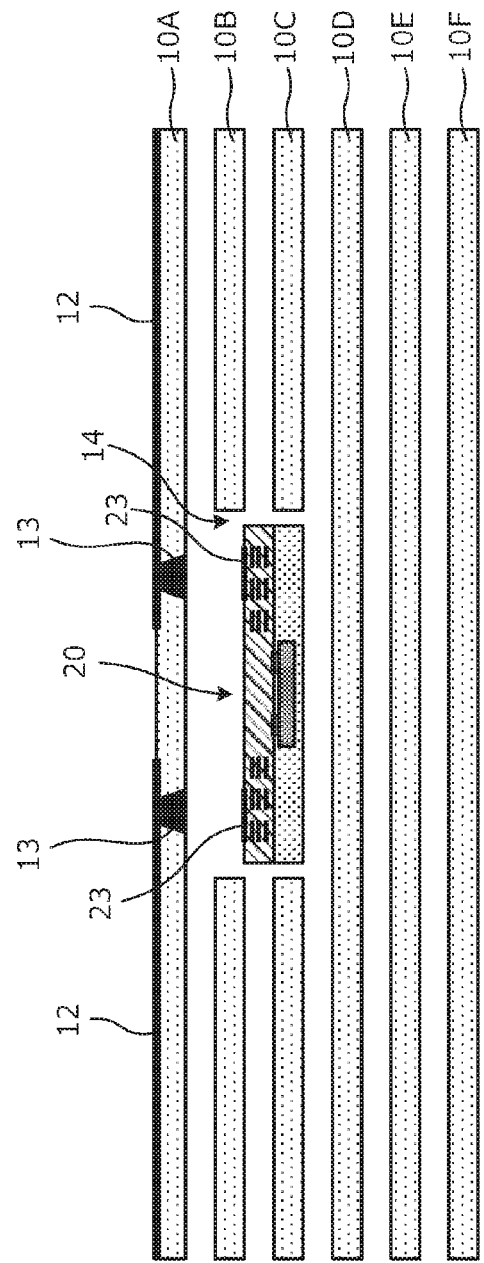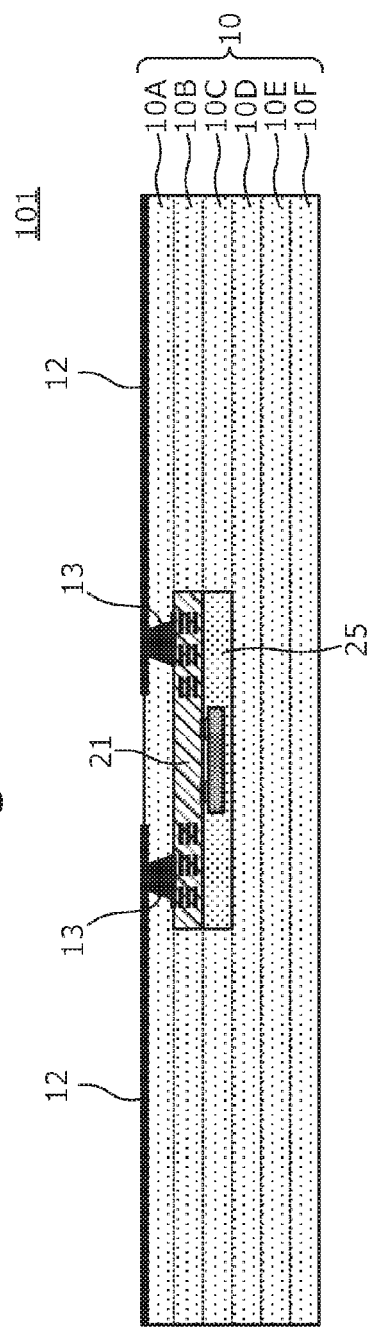

COMPOSITE DEVICE WITH SUBSTRATE AND MOUNTED COMPONENT

CROSS REFERENCE TO RELATED APPLICATIONS

This application claims the benefit of priority to Japanese Patent Application No. 2014-211502 filed on Oct. 16, 2014 and is a Continuation Application of PCT Application No. PCT/JP2015/078717 filed on Oct. 9, 2015. The entire contents of each application are hereby incorporated herein by reference.

BACKGROUND OF THE INVENTION

1. Field of the Invention

The present invention relates to a composite device including a mounted component such as a chip component and a semiconductor module component, and a substrate in which the mounted component is mounted.

2. Description of the Related Art

When a mounted component such as a chip component and a semiconductor module component is mounted in a substrate such as a printed-circuit board, a conductive bonding material is usually used. In general, a terminal electrode of the mounted component is electrically and mechanically bonded to a land of the substrate with solder.

As the conductive bonding material, International Publication No. 2013/132942 discloses a Sn-Cu-Ni alloy-based material. When this conductive bonding material is used, heating at a level of 300° C. accelerates a change into an intermetallic compound having a high melting point of 400° C. or more, and consequently a low-melting point component does not remain. Therefore, for example, in a semiconductor device manufacturing process, after a semiconductor device is manufactured through a soldering step, even when the semiconductor device is mounted in a substrate by a reflow soldering method, a soldering part based on the conductive bonding material is superior in heat-resistant strength, and thus the soldering part is not re-melted in a reflow soldering step, enabling highly reliable mounting.

In recent years, mounted components are more and more miniaturized, and as a result, the size of the land on the substrate is also miniaturized to allow mounted components to be mounted thereon. Therefore, in a structure of mounting with solder, it is getting more difficult to sufficiently maintain the mechanical strength of mounted portions.

SUMMARY OF THE INVENTION

Preferred embodiments of the present invention provide a composite device with a mounted component and a substrate in which the mounted component is mounted. The composite device is also adaptive to mounted components that are further miniaturized.

A composite device according to a preferred embodiment the present invention includes a substrate and a mounted component mounted to a surface of the substrate. The substrate includes a first thermoplastic resin layer, at least a surface of the mounted component includes a second thermoplastic resin layer that includes a same or a similar material as that of the first thermoplastic resin layer, and is located between the second thermoplastic resin layer and the first thermoplastic resin layer, a conductive bonded portion including a conductive bonding material is provided, and a bonding layer that bonds the second thermoplastic resin layer and the first thermoplastic resin layer together is provided.

According to the features described above, the mounted component is mechanically (structurally) bonded to the substrate through the bonding layer. Therefore, even when the mounted component is small, stability of electrical bonding between a terminal of the mounted component and a land on the substrate side is ensured and significantly improved.

According to a preferred embodiment of the present invention, at least one of the first thermoplastic resin layer and the second thermoplastic resin layer is flexible. As a result, when a bonding layer is provided between a bonded surface of the second thermoplastic resin layer and a bonded surface of the first thermoplastic resin layer, the adhesiveness between the bonded surfaces is high, and the bonding layer is easily provided.

According to a preferred embodiment of the present invention, the mounted component is a component in which an IC chip is on a surface of a base material including the second thermoplastic resin layer. Thus, a process of manufacturing a mounted component (semiconductor package) including a thermoplastic resin layer is able to be simplified.

According to a preferred embodiment of the present invention, a mounted component includes, around the IC chip, a protective layer comprising a third thermoplastic resin layer that includes a same or a similar material as that of the second thermoplastic resin layer. Thus, a mounted component (semiconductor package), the upper and lower surfaces of which each includes a thermoplastic resin layer, is able to be easily provided.

According to a preferred embodiment of the present invention, the mounted component may include, around the IC chip, a protective layer comprising a thermosetting resin layer.

According to a preferred embodiment of the present invention, a mounted component is a component (semiconductor package) in which a base material including the second thermoplastic resin layer includes a built-in IC chip. Thus, the mounted component is thin, and includes a thermoplastic resin layer around the IC chip, and therefore a thin composite device is able to be provided.

According to a preferred embodiment of the present invention, the mounted component is a component in which the second thermoplastic resin layer is affixed to a portion of the IC chip. Thus, a process for manufacturing a mounted component (semiconductor package) including a thermoplastic resin layer is able to be simplified.

According to a preferred embodiment of the present invention, a substrate includes a structure in which a plurality of thermoplastic resin layers including the first thermoplastic resin layer are laminated. Thus, a circuit in the substrate, together with a mounted component, is able to easily provide a composite device with higher functionality.

According to a preferred embodiment of the present invention, the substrate is a collective substrate including a plurality of child board regions, and the mounted component is an RFIC package on a portion of a conductive pattern at an edge of the collective substrate. Thus, RFID management of the collective substrate in the process of manufacturing a composite device in a collective substrate state is able to be provided.

According to a preferred embodiment of the present invention, between the second thermoplastic resin layer and the first thermoplastic resin layer, all bonding regions other than the conductive bonded portion define the bonding layer.

According to a preferred embodiment of the present invention, the conductive bonded portion is embedded into the substrate.

According to preferred embodiments of the present invention, a mounted component is mechanically (structurally) bonded to a substrate through a bonding layer. Therefore, even when the mounted component is small, the stability of electrical bonding between a terminal of the mounted component and a land on the substrate side is ensured.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 4A and 4B are cross-sectional views showing a main portion of the composite device shown in FIG. 1.

DETAILED DESCRIPTION OF THE PREFERRED EMBODIMENTS

Figure 1A:
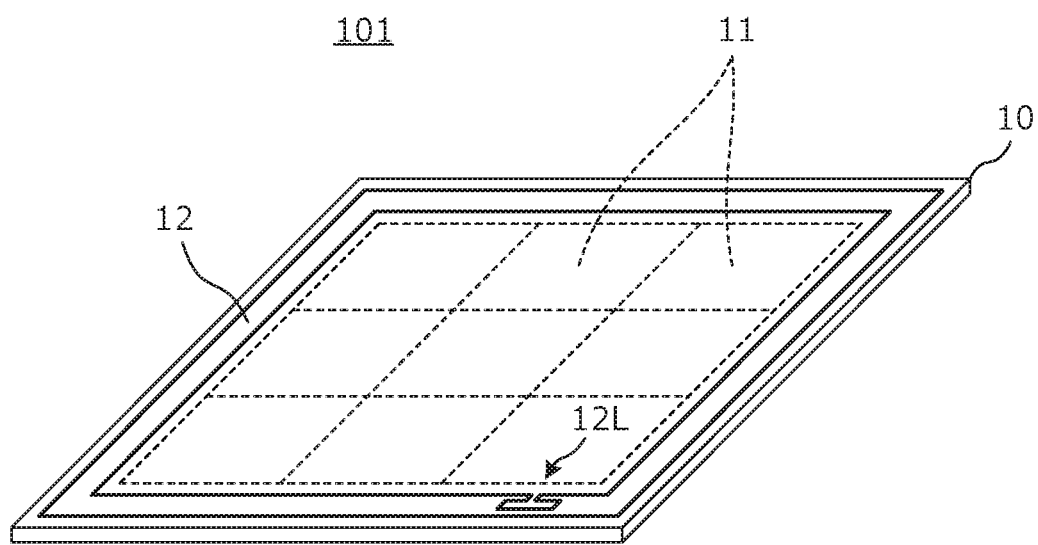
FIG. 1A is a perspective view of a composite device according to a first preferred embodiment of the present invention.

Hereinafter, preferred embodiments of the present invention will be described using some specific examples with reference to accompanying drawings. In the drawings, the same reference numerals are used to denote the same elements. In the second and subsequent preferred embodiments hereinafter described below, descriptions of elements identical to those of the first preferred embodiment are omitted, and elements that differ from those of the first preferred embodiment will be described. In particular, similar effects produced by similar configurations and arrangements will not be mentioned one by one on a preferred embodiment basis.

First Preferred Embodiment

Figure 1B:
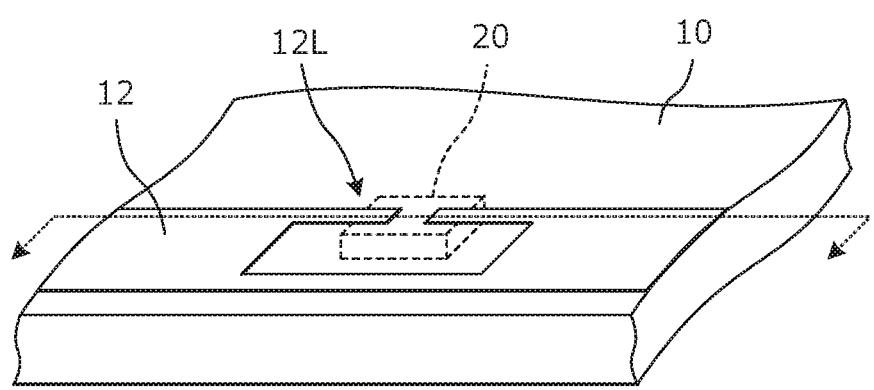
FIG. 1B is a partially enlarged perspective view of the composite device shown in FIG. 1A.

FIG. 1A is a perspective view of a composite device 101 according to a first preferred embodiment of the present invention. FIG. 1B is a partially enlarged perspective view of the composite device 101.

The composite device 101 is provided with a substrate and a mounted component 20 that is mounted inside the substrate 10, and provides a wireless communication device that preferably uses, for example, a UHF band.

The substrate 10 is a collective substrate (mother board) including a plurality of child board regions 11 arranged in a lattice shape or other suitable shape. The substrate 10 includes a multilayer structure formed preferably by laminating thermoplastic resin layers (first thermoplastic resin layers), for example, LCP (Liquid Crystal Polymer) and PI (polyimide). An edge surrounding the substrate 10 includes a loop shaped edge conductive pattern 12. Each thermoplastic resin layer is flexible, and thus the substrate 10 is flexible. The mounted component 20 is mounted under the edge conductive pattern 12 inside the substrate 10. A portion of the conductive pattern 12 includes a loop portion 12L.

As shown in FIG. 1B, the mounted component 20 is connected to the loop portion 12L of the conductive pattern 12. In other words, two terminals of the mounted component 20 are connected to two end portions of the loop portion 12L, respectively. The conductive pattern 12 at the edge defines and functions as a radiator, and the loop portion 12L performs impedance matching to match the impedance between the mounted component and the conductive pattern 12. The conductive pattern that is provided at the end portion of the substrate 10 is not limited to a loop shape, but may define, for example, a dipole radiator.

Figure 2:
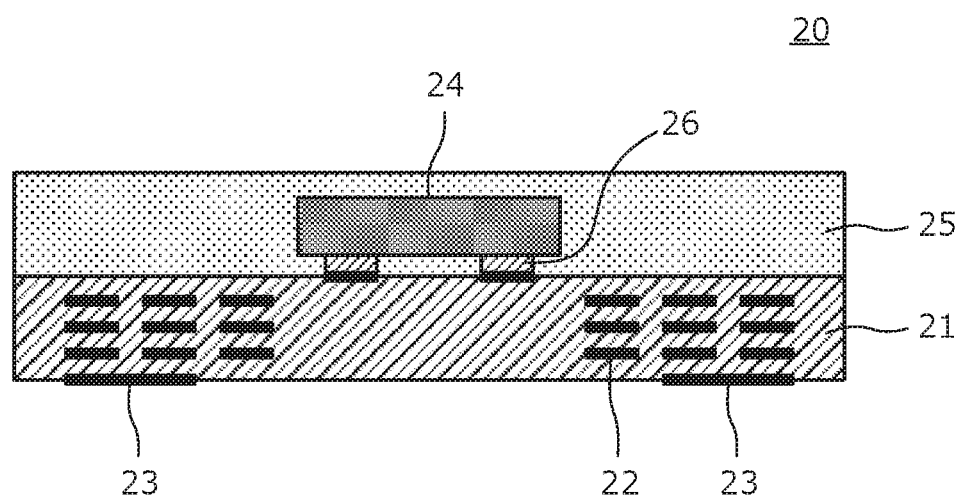
FIG. 2 is a cross-sectional view of a mounted component according to a preferred embodiment of the present invention.
Figure 3:
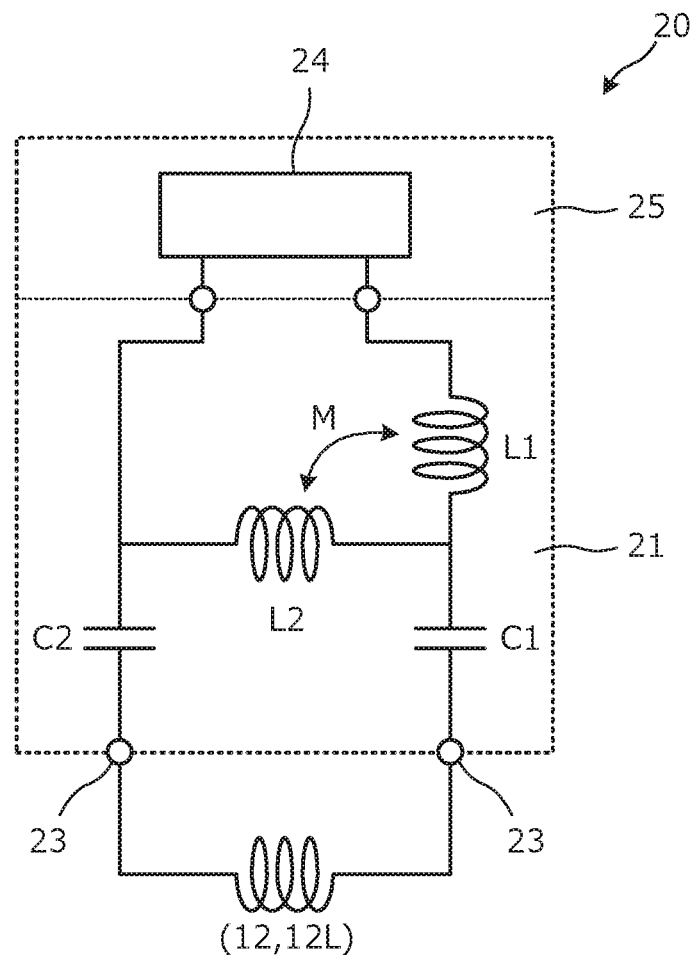
FIG. 3 is a circuit diagram showing the mounted component shown in FIG. 2.

FIG. 2 is a cross-sectional view of the mounted component 20. FIG. 3 is a circuit diagram showing the mounted component 20. The mounted component 20 is preferably an RFIC package that is formed preferably by packaging an RFIC chip. The mounted component 20 includes a structure in which an IC chip 24, for example, an RFIC chip, is placed on the surface of a base material 21. A protective layer 25 is provided around the IC chip 24.

The base material 21 is a laminate of a thermoplastic resin layer (a second thermoplastic resin layer) that includes a same or a similar material as that of the thermoplastic resin layer (the first thermoplastic resin layer) of the substrate 10. A circuit pattern 22 is provided inside the base material 21, and each terminal electrode 23 is provided on the lower surface of the base material 21. The circuit pattern 22 includes an inductor and/or a capacitor based on an in-plane conductor pattern, an interlayer conductor pattern or the like. The circuit pattern 22 includes a resonant circuit with a predetermined resonance frequency, and defines a broad-band matching circuit that is able to provide broad-band impedance matching.

The IC chip 24 is mounted on the upper surface of the base material 21 through a conductive bonding material 26. The IC chip 24 is mounted to the base material 21 by bonding, for example, with Ag nanoparticles. The protective layer 25 is a thermoplastic resin layer (a third thermoplastic resin layer) that includes a same or a similar material as that of the thermoplastic resin layer (the first thermoplastic resin layer) of the substrate 10. Here, "the thermoplastic resin that includes a same or a similar material" is a resin in which thermal treatment at a given temperature enables the interface of each thermoplastic resin layer to melt/combine. More specifically, "the thermoplastic resin that includes a same or a similar material" refers to a thermoplastic resin layer including a same or a similar polymer component as a main component. For example, when the first thermoplastic resin is LCP, the second thermoplastic resin is also LCP; and when the first thermoplastic resin is PI, the second thermoplastic resin is also PI. However, the melting temperature of each thermoplastic resin layer may differ. It is preferable that when the melting temperature differs, the range preferably is about ±50° C., for example.

The terminal electrode 23 is directly connected, or is electrically connected through a capacitor, to terminal electrodes (two end portions of the loop portion 12L) of the mother board 10. When the circuit pattern 22 includes a coil pattern, the IC chip 24 may be electrically connected through magnetic field coupling between this coil pattern and the loop portion 12L.

The base material 21 includes a thermoplastic resin (the second thermoplastic resin layer) that includes a material that is the same as or similar to that of the thermoplastic resin (the first thermoplastic resin) of the substrate 10, and the protective layer 25 includes a thermoplastic resin (the third thermoplastic resin layer) that includes a material that is the same as or similar to that of the thermoplastic resin (the first thermoplastic resin) of the substrate 10. However, a thermoplastic resin that includes a material that is the same as or similar to that of the thermoplastic resin of the substrate 10 may be only the base material 21 or only the protective layer 25. As an example, the protective layer 25 may include a thermosetting resin, for example, epoxy, which differs from the material of the thermoplastic resin (the first thermoplastic resin).

As shown in FIG. 3, a matching circuit that includes inductors L1, L2 and capacitors C1, C2 is provided between the IC chip 24 and the terminal electrode 23. The inductor L1 is inserted between one terminal of the IC chip 24 and one of the terminal electrodes 23, and the inductor L2 is inserted between one terminal and the other terminal of the IC chip 24. In the example shown in FIG. 3, the inductor L2 is inserted between one terminal and the other terminal of the IC chip 24 through the inductor L1. The inductor L1 and the inductor L2 are coupled through a magnetic field M. The capacitor C1 is inserted between one terminal of the IC chip 24 and one of the terminal electrodes 23. In the example shown in FIG. 3, the capacitor C1 is inserted between one terminal of the IC chip 24 and one of the terminal electrodes 23 through the inductor L1. The capacitor C2 is inserted between the other terminal of the IC chip 24 and the other terminal electrode 23. The capacitors and inductors described above define a feeder circuit with a plurality of resonance frequencies, which widens the bandwidth. The resonance frequency of the resonant circuit preferably corresponds to a communication frequency of the wireless communication device.

FIGS. 4A and 4B are cross-sectional views showing a main portion of the composite device 101. FIG. 4A is a cross-sectional view showing an arrangement of each of the first thermoplastic resin layers and the mounted component 20 before the lamination of the substrate 10. FIG. 4B is a cross-sectional view after the lamination of the substrate 10.

The substrate 10 is a structure in which a plurality of thermoplastic resin layers including the first thermoplastic resin layers 10A, 10B, 10C, 10D, 10E, 10F are laminated. The mounted component 20 is included in the substrate 10. The first thermoplastic resin layers 10B, 10C are provided with a cavity 14. The edge conductive pattern 12 is provided on the upper surface of the first thermoplastic resin layer 10A, and via conductors 13 are provided inside the first thermoplastic resin layer 10A.

As described above, the first thermoplastic resin layers 10A to 10F include a material that is the same as or similar to a material as that of the base material 21 of the mounted component 20 and that of the thermoplastic resin layer of the protective layer 25.

By laminating and then heating and pressing the mounted component 20 together with the first thermoplastic resin layers 10A to 10F, the first thermoplastic resin layers 10A to 10F are thermo-compressed between adjacent interlayers. In addition, the resin layers 10A, 10B and the base material 21 of the mounted component 20 are thermo-compressed, and the resin layers 10C, 10D and the protective layer 25 of the mounted component 20 are thermo-compressed. Moreover, the via conductors 13 provide electrical continuity to the terminal electrodes 23 of the mounted component 20, respectively. The temperature at the time of the thermo-compression bonding is, for example, about 300° C.

Figure 5:
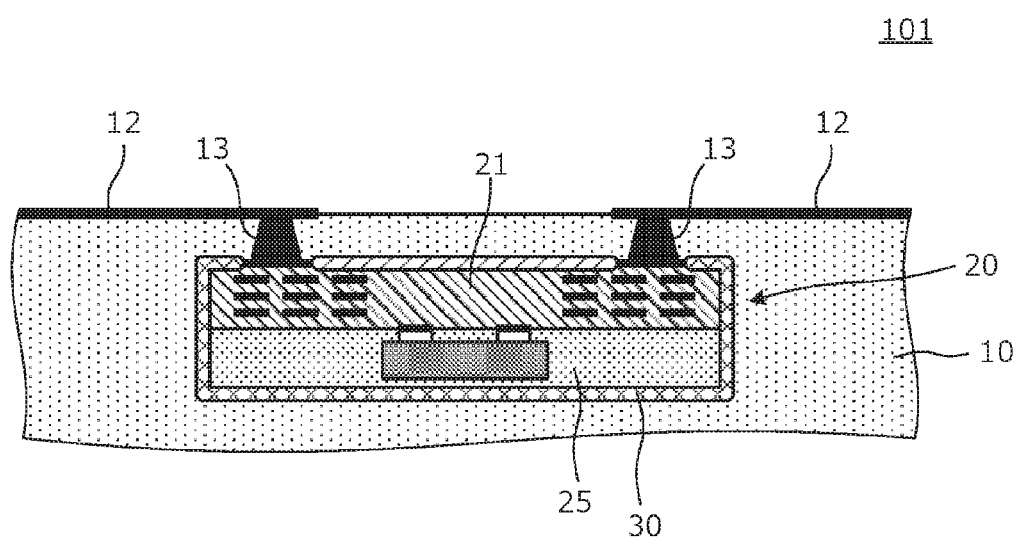
FIG. 5 is a cross-sectional view showing a bonding layer provided in a bonded portion between a substrate and the mounted component shown in FIG. 2 buried in the substrate.

FIG. 5 is a cross-sectional view showing a bonding layer provided in a bonded portion between the substrate 10 and the mounted component 20 buried in the substrate 10.

By thermo-compressing the base material 21 of the mounted component 20 and the protective layer 25, a bonding layer 30 is provided between the first thermoplastic resin of the substrate 10 and the second thermoplastic resin layer of the mounted component 20. The bonding layer 30 is a mixed layer provided between a polymer component of the first thermoplastic resin layer and a polymer component of the second thermoplastic resin layer, and differs in resin (polymer) density from the other portions, that is, portions other than the interface.

The substrate 10 is flexible, and therefore when a bonding layer is provided between a bonded surface of the thermoplastic resin layer of the substrate 10 and a bonded surface of the thermoplastic resin layer of the mounted component 20, the adhesiveness between the bonded surfaces is high, and the bonding layer 30 is able to be easily formed.

The via conductors 13 are formed preferably by metalizing a conductive paste. The conductive paste includes, for example, a low-melting-point metal powder (Sn) and an alloy powder (Cu—Ni alloy, Cu—Mn alloy) that is able to form an intermetallic compound with the low-melting-point metal powder at or above the melting temperature of the low-melting-point metal powder. Heating causes the paste to solidify without passing through a molten state.

The details of the materials are disclosed in International publication No. 2012/066795, International publication No. 2012/086745, International publication No. 2012/108395, and the like.

The solidified metal body is an intermetallic compound with a melting point of about 400° C. or more, for example. In other words, the terminal electrodes of the mounted component 20 are electrically-connected to the frame-shaped conductive patterns 12 of the substrate 10 through the via conductors 13, respectively. The end surfaces of the via conductors 13 may be connected to the terminal electrodes 23, respectively, through a solid solution phase, but may also be connected to the terminal electrodes 23, respectively, by simple physical contact. In particular, when the base material 21 and the substrate 10 include the same or similar material, which is a thermosetting resin, the interface therebetween is strongly bonded. Therefore, a metal solid solution phase between the electrode on a side of the substrate 10 and the electrode on a side of the base material 21 may be omitted.

According to the first preferred embodiment, the substrate 10 and the mounted component 20 are bonded together even in the case of thermoplastic resin layers, and therefore element assemblies themselves of the substrate 10 and the mounted component 20 are mechanically bonded together. Accordingly, even when the land of the substrate 10 and the terminal electrode of the mounted component 20 are small, the mechanical strength of bonding between the substrate 10 and the mounted component 20 is able to be maintained.

Further according to the first preferred embodiment, the substrate 10 and the mounted component 20 are based on the same or similar thermoplastic resin layers, and therefore a difference in thermal expansion coefficient is small, and consequently, delamination or the like hardly occurs between the substrate 10 and the mounted component 20.

Also according to the first preferred embodiment, when an LCP (Liquid Crystal Polymer), which has a small relative permittivity and a high Q value, is included in a thermoplastic resin layer, a high-frequency composite device that handles a high frequency signal is able to be provided.

Second Preferred Embodiment

A second preferred embodiment of the present invention shows another example of the mounted component 20. In contrast to the mounted component shown in FIG. 2 and the like in the first preferred embodiment, an IC chip is buried inside a base material in the second preferred embodiment.

Figure 6A:
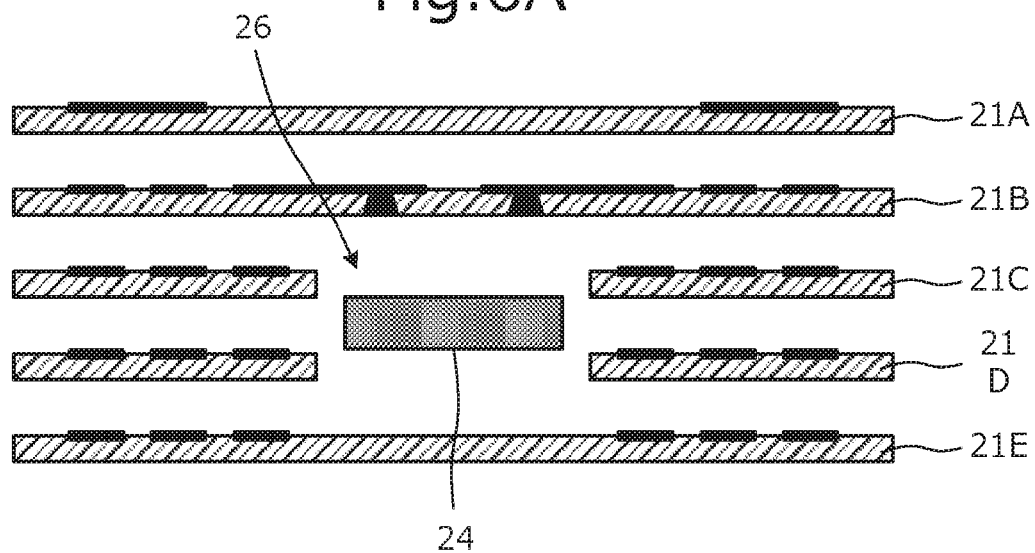
FIGS. 6A and 6B are views showing a structure of the mounted component mounted in a composite device according to a second preferred embodiment of the present invention.
Figure 6B:
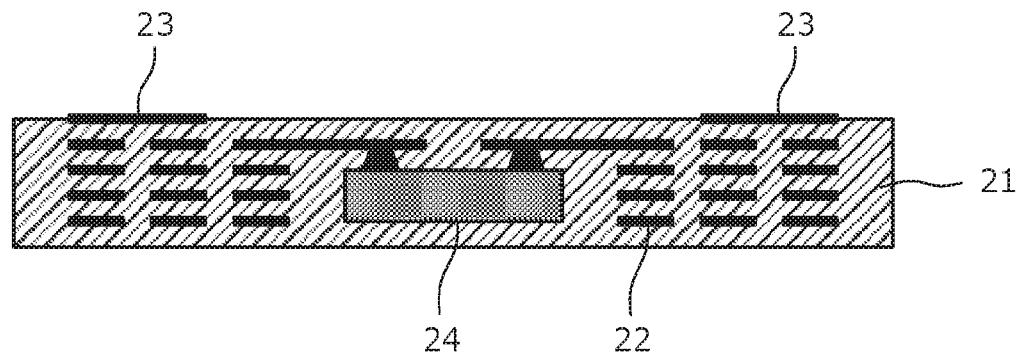

FIGS. 6A and 6B are views showing a structure of the mounted component 20 mounted in a composite device according to the second preferred embodiment. FIG. 6A is a cross-sectional view showing a state before the mounted component 20 is laminated. FIG. 6B is a cross-sectional view showing a state after the mounted component 20 has been laminated. The mounted component 20 is provided with base materials 21A, 21B, 21C, 21D, 21E and an IC chip 24. The base materials 21C, 21D are provided with a cavity, and the IC chip 24 is stored in the cavity. The mounted component 20 is formed preferably by laminating the base materials 21A, 21B, 21C, 21D, 21E together with the IC chip 24. Accordingly, the IC chip 24 is buried inside the base material 21, and thus the protective layer 25 shown in FIG. 2 may be omitted.

Figure 7:
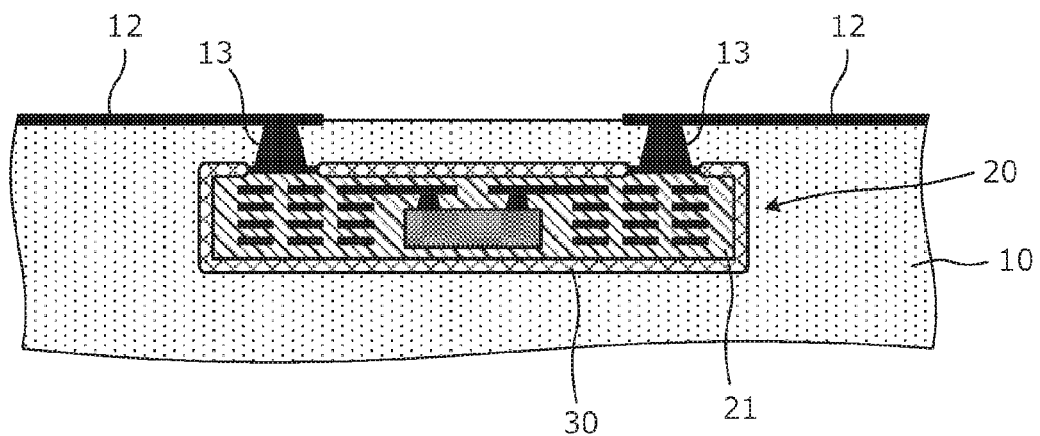
FIG. 7 is a cross-sectional view of a main portion of a composite device according to the second preferred embodiment of the present invention.

FIG. 7 is a cross-sectional view of a main portion of the composite device 102 according to the second preferred embodiment. By thermo-compressing, the bonding layer 30 is provided between the first thermoplastic resin of the substrate and the second thermoplastic resin layer of the mounted component 20. The bonding layer 30 is a layer in which each thermoplastic resin layers are melted and mixed.

Third Preferred Embodiment

Figure 8A:
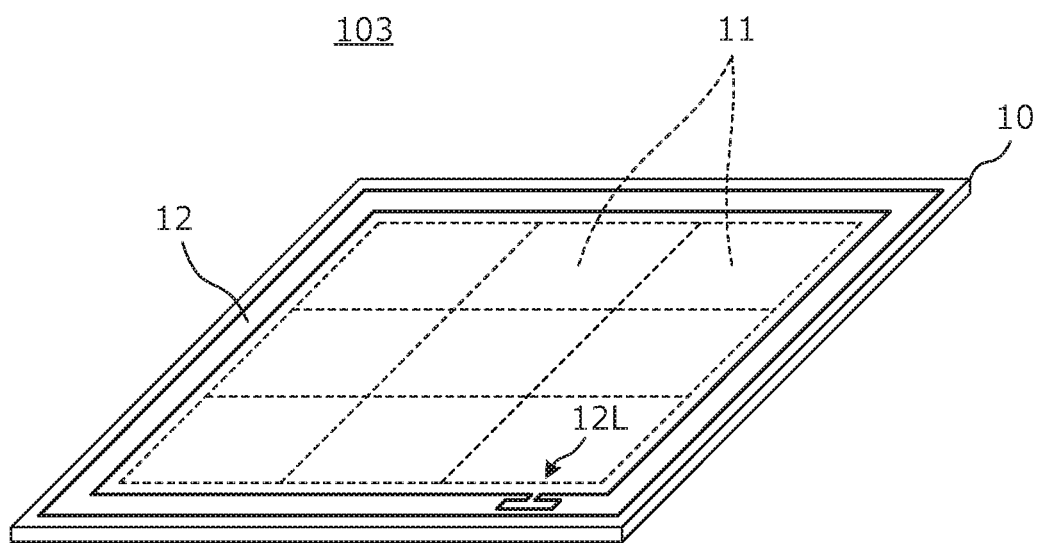
FIG. 8A is a perspective view of a composite device according to a third preferred embodiment of the present invention.
Figure 8B:
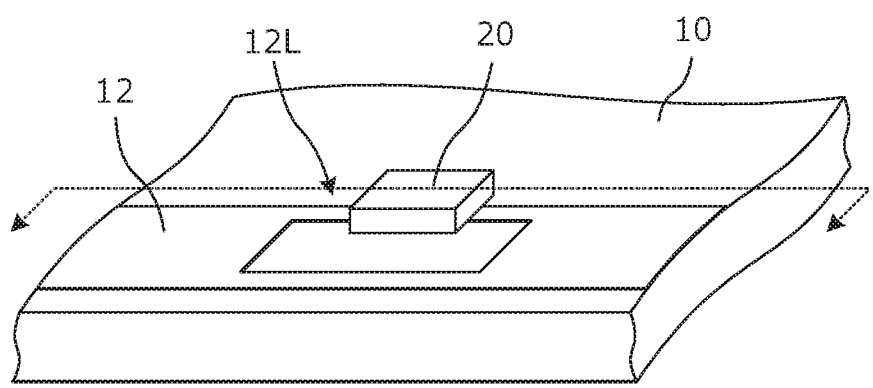
FIG. 8B is a partially enlarged perspective view of the composite device shown in FIG. 8A.

FIG. 8A is a perspective view of a composite device 103 according to a third preferred embodiment of the present invention. FIG. 8B is a partially enlarged perspective view of the composite device 103.

The composite device 103 is provided with the substrate 10 and the mounted component 20. The third preferred embodiment differs from the first preferred embodiment in the structure of mounting the mounted component 20. In the third preferred embodiment, the mounted component 20 is mounted on the upper surface of the substrate 10.

Figure 9A:
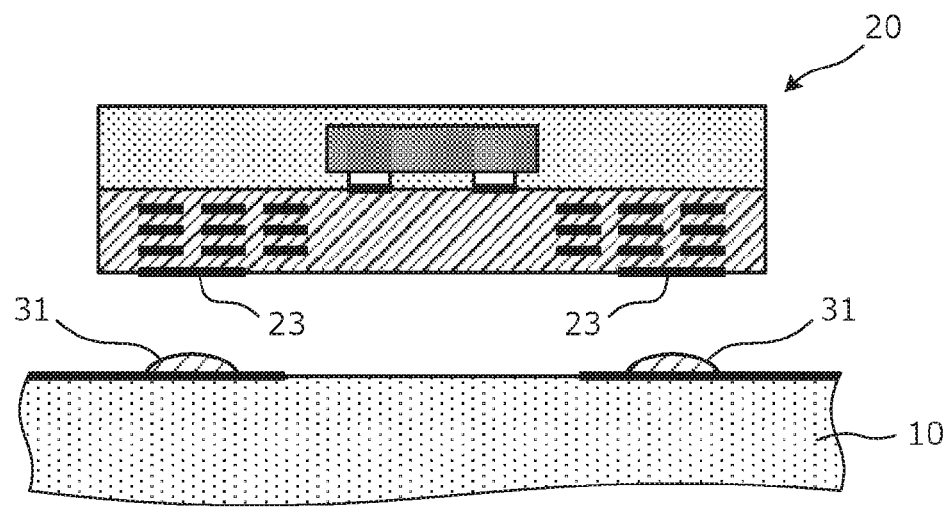
FIGS. 9A-9C are views showing a structure of mounting a mounted component to a substrate according to a preferred embodiment of the present invention.
Figure 9B:
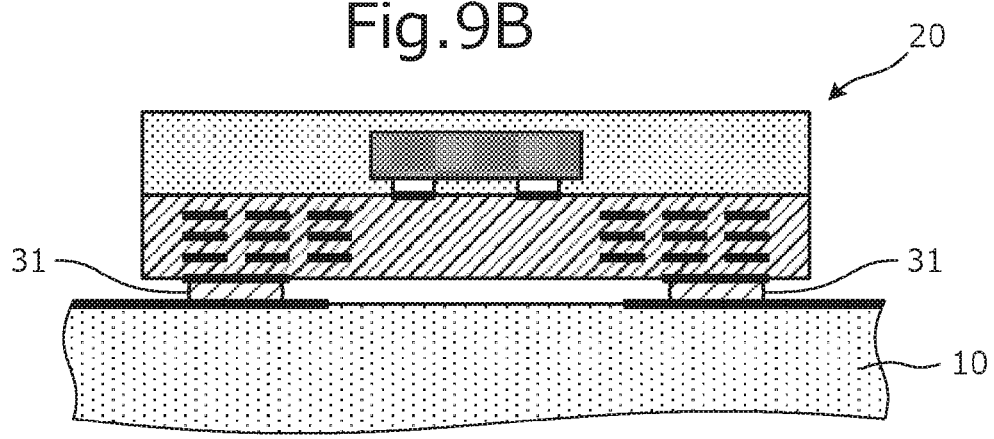
Figure 9C:
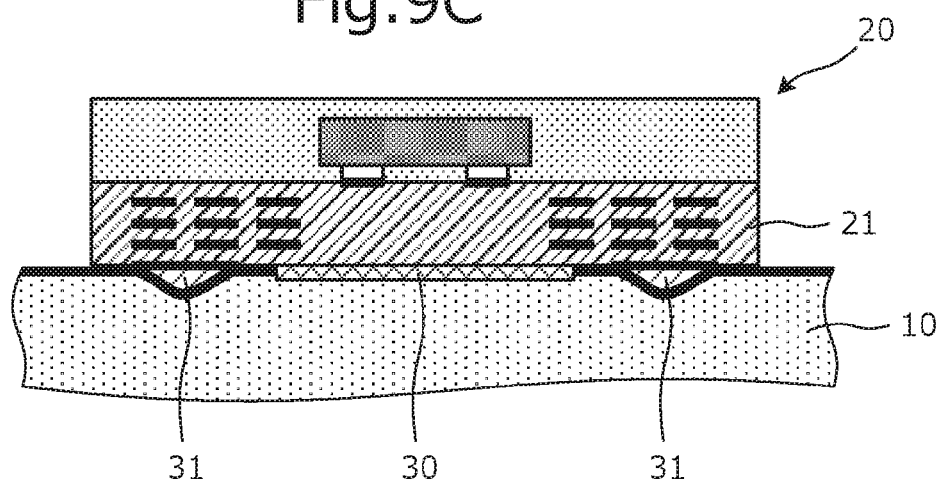

FIGS. 9A-9C are views showing a structure of mounting the mounted component 20 to the substrate 10. FIG. 9A is a cross-sectional view showing a state immediately before the mounted component 20 is mounted to the substrate 10. FIG. 9B is a cross-sectional view showing a state during the mounting of the mounted component 20 to the substrate 10. FIG. 9C is a cross-sectional view showing a state after the mounted component 20 has been mounted to the substrate 10.

The base material of the mounted component 20, for example, an RFIC package, is thermoplastic resin, for example, LCP, PI, and the like.

As shown in FIG. 9A, a conductive bonding material 31 (conductive bonding material paste) is printed on the land of the substrate 10. As described above with respect to the first preferred embodiment, the paste includes, for example, low-melting-point metal powder (Sn) and alloy powder (Cu—Ni alloy, Cu—Mn alloy) that is able to form an intermetallic compound with the low-melting-point metal powder at or above the melting temperature of this low-melting-point metal powder. Heating causes the paste to solidify without passing through a molten state.

Subsequently, the paste is subjected to thermal treatment, thus solidifying the conductive bonding material 31, as shown in FIG. 9B. In other words, by heating the paste to or above the melting temperature of the low-melting-point metal powder (for example, about 230° C. or more), Sn and Cu—Ni (or Cu—Mn) are reacted with each other to form the intermetallic compound. The intermetallic compound has a higher melting temperature, for example, about 400° C. or more.

Subsequently, as shown in FIG. 9C, the mounted component 20 is subjected to thermal treatment while pressure is applied to the mounted component 20 from the upper side. This causes the thermoplastic resin to soften and flow, and consequently the solidified conductive bonding material 31 digs or enters into a side of the substrate 10. The solidified conductive bonding material 31 digs into the side of the substrate 10 due to the conductor density on the side of the substrate 10 being low. Many conductive patterns may be laminated in the base material 21 of the mounted component 20, and therefore the rigidity of the base material 21 is relatively high, and consequently the solidified conductive bonding material 31 does not dig into the base material 21 side. In addition, in this case, the thermoplastic resin layer on the mounted component 20 side and the thermoplastic resin layer on the side of the substrate 10 start melting at the interface therebetween. As the result, the bonding layer 30 is provided in the interface portion.

When the mounted component 20 provided with the terminal electrode 23 including an Au bump is included, the land of the substrate 10 may be subjected to ultrasonic bonding while the land of the substrate 10 is heated.

Fourth Preferred Embodiment

Figure 10A:
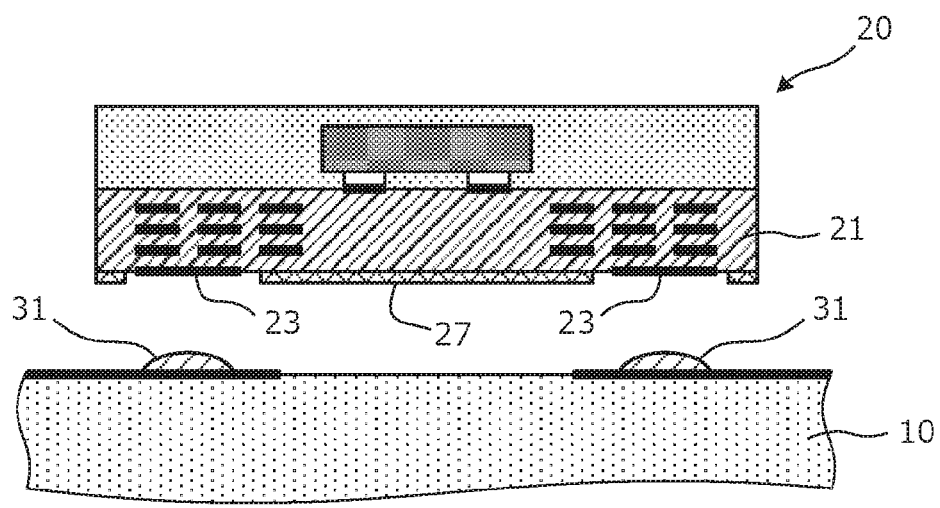
FIGS. 10A and 10B are views showing a structure of mounting the mounted component to the substrate of a composite device according to a fourth preferred embodiment of the present invention.
Figure 10B:
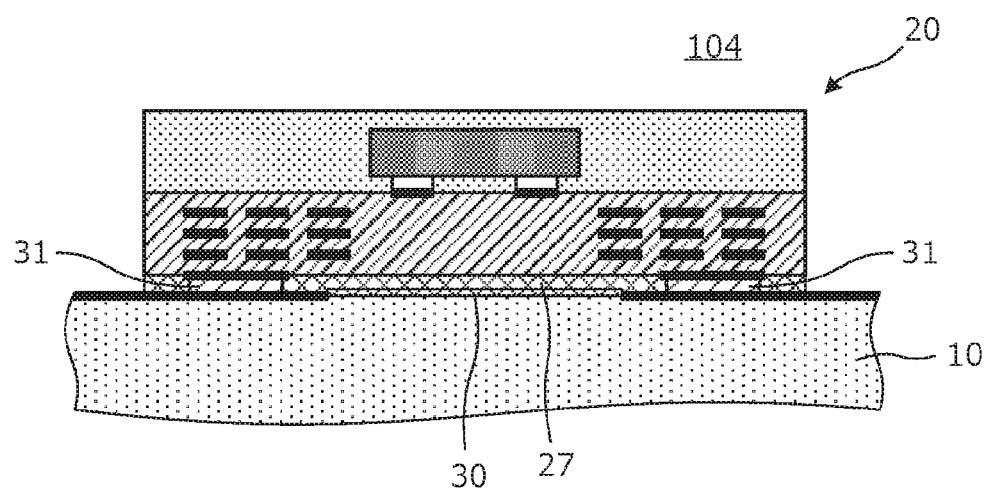

FIGS. 10A and 10B are views showing a structure of mounting the mounted component 20 to the substrate 10 of a composite device 104 according to a fourth preferred embodiment of the present invention. FIG. 10A is a cross-sectional view showing a state immediately before the mounted component 20 is mounted to the substrate 10. FIG. 10B is a cross-sectional view showing a state after the mounted component 20 has been mounted to the substrate 10.

The mounted component 20 and the substrate 10 include features similar to the third preferred embodiment. However, in the fourth preferred embodiment, a thermoplastic resin layer 27 is provided or affixed on the lower surface of the base material 21 of the mounted component 20. The thermoplastic resin layer 27 is preferably a thermoplastic resin sheet, but is not limited thereto. The thermoplastic resin layer 27 may be formed by applying, for example, a pasty thermoplastic resin on the lower surface of the base material 21.

As shown in FIG. 10A, the conductive bonding material (conductive bonding material paste) is printed on the land of the substrate 10. Subsequently, the paste is subjected to thermal treatment, thus solidifying the conductive bonding material 31 as shown in FIG. 10B. In other words, by heating the paste to or above the melting temperature of the low-melting-point metal powder (for example, about 230° C. or more), Sn and Cu—Ni alloy (or Cu—Mn alloy) are reacted with each other to form the intermetallic compound. In addition, the thermoplastic resin layer 27 and the thermoplastic resin layer on a side of the substrate 10 start melting at the interface therebetween. As the result, the bonding layer 30 is formed in the interface portion.

According to the fourth preferred embodiment, even when the base material 21 of the mounted component 20 is not a thermoplastic resin, the base material 21 is bonded through the bonding layer that bonds thermoplastic resin layers together.

Fifth Preferred Embodiment

Figure 11:
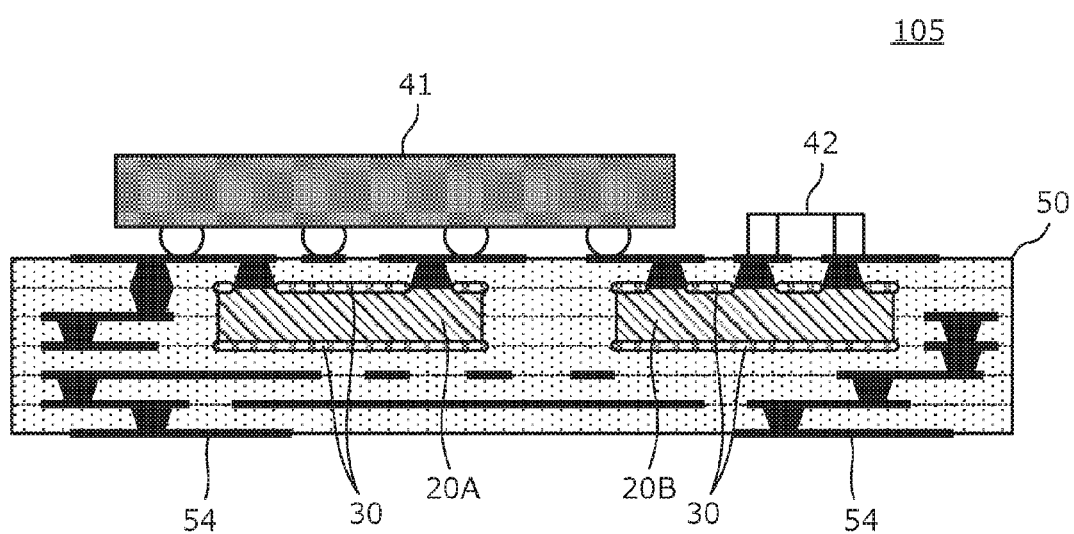
FIG. 11 is a cross-sectional view of a composite device according to a fifth preferred embodiment of the present invention.

A fifth preferred embodiment of the present invention shows an example in which a composite device is a module component. FIG. 11 is a cross-sectional view of a composite device 105 according to a fifth preferred embodiment. The composite device 105 may be, for example, a high-frequency module, a power supply module, or the like. A module substrate 50 is a laminate including a plurality of thermoplastic resin layers, for example, LCP, PI, and the like.

Mounted components 20A, 20B are mounted inside the module substrate 50. The mounted components 20A, 20B are similar to the mounted component 20 shown in the second preferred embodiment, as shown in FIG. 6B. However, according to the fifth preferred embodiment, the bonding layers 30 are formed on the upper and lower surfaces of the mounted components 20A, 20B.

Preferably, the module substrate 50 and each of the mounted components 20A, 20B are flexible, for example. However, any of the module substrate 50 and the mounted components 20A, 20B may be flexible. For example, even when the module substrate 50 is rigid while the mounted components 20A, 20B are flexible, when a bonding layer is formed between a bonded surface of each thermoplastic resin layer of the module substrate 50 and a bonded surface of each thermoplastic resin layer of each of the mounted components 20A, 20B, the adhesiveness between the bonded surfaces is high, and the bonding layers 30 are able to be easily formed.

A surface mount component 41 that is mounted on the upper surface of the module substrate 50 is a semiconductor package, for example, an RFIC package. However, the outer surface of the surface mount component 41 preferably is formed of thermoplastic resin, for example, epoxy. In addition, for example, the surface mount component 42 of a passive component, for example, a ceramic capacitor is mounted on the upper surface of the module substrate 50.

A terminal electrode 54 is formed on a mounting surface of the module substrate 50, that is, on the lower surface of the module substrate 50 in the direction shown in FIG. 11. The composite device 104 is provided by connecting the terminal electrode 54 to the land of the mother board.

Sixth Preferred Embodiment

Figure 12A:
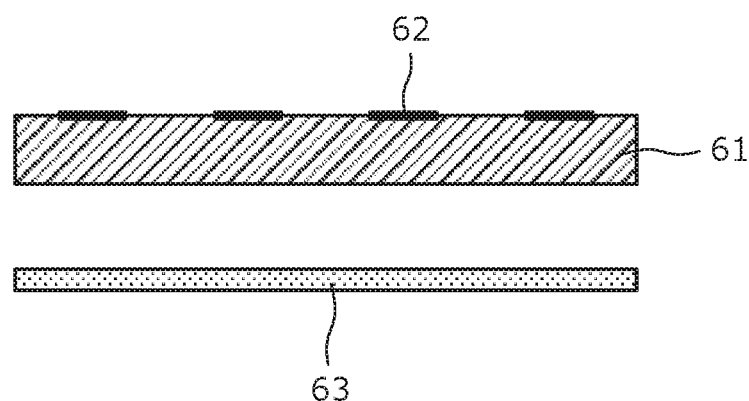
FIGS. 12A and 12B are cross-sectional views showing a mounted component 60 including a thermoplastic resin which is provided in a composite device according to a sixth preferred embodiment of the present invention.
Figure 12B:
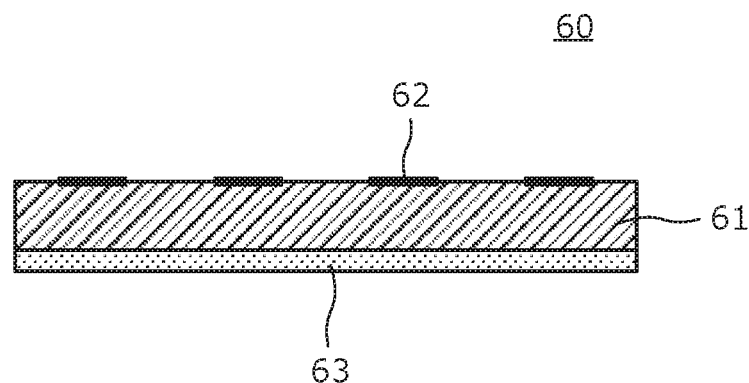

FIGS. 12A and 12B are cross-sectional views showing a mounted component 60 including a thermoplastic resin which is provided in a composite device according to a sixth preferred embodiment of the present invention. FIG. 12A is a cross-sectional view showing a state during manufacturing of the mounted component 60. FIG. 12B is a cross-sectional view of the mounted component 60 including a thermoplastic resin after manufacturing is completed. An IC chip 61 is, for example, an IC chip with a CSP (Chip Size Package) structure. A thermoplastic resin layer 63 is affixed on the circuit formation surface side of the IC chip 61 by an adhesive with a heat resistance of, for example, about 300° C. or more. Alternatively, the thermoplastic resin layer 63 may be provided or affixed directly on the circuit formation surface side of the IC chip 61 by subjecting the surface on the circuit formation surface side of the IC chip 61 to surface roughening treatment.

Figure 13:
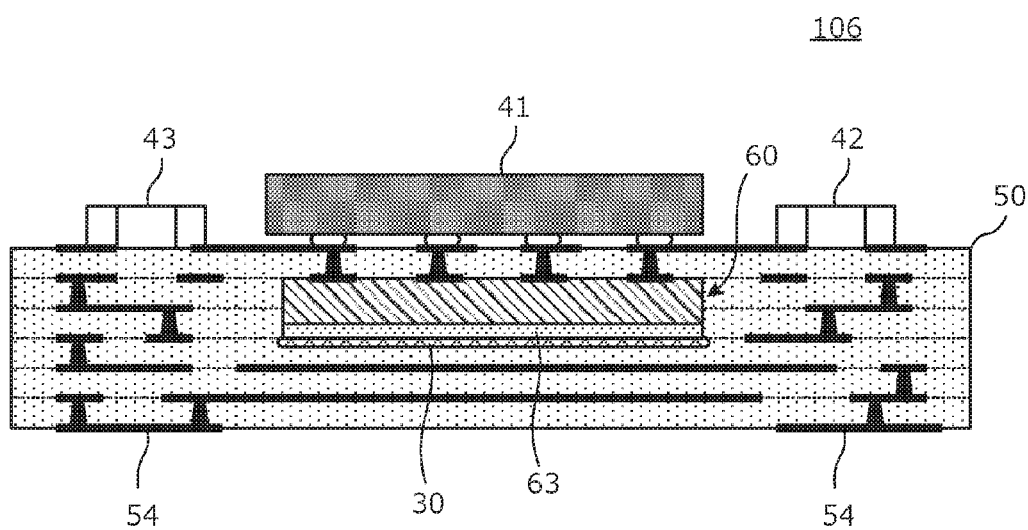
FIG. 13 is a cross-sectional view of a composite device according to the sixth preferred embodiment of the present invention.

FIG. 13 is a cross-sectional view of a composite device 106 according to the sixth preferred embodiment. The module substrate 50 is a laminate including a plurality of thermoplastic resin layers, for example, LCP, PI, and the like. The mounted component 60 including a thermoplastic resin is mounted inside the module substrate 50. The bonding layer 30 is formed in a bonded portion between the thermoplastic resin layer 63 of the mounted component 60 including the thermoplastic resin and the thermoplastic resin layer of the module substrate 50.

Surface mount components 41, 42, 43 and the like are mounted on the upper surface of the module substrate 50. The terminal electrode 54 is formed on the mounting surface of the module substrate 50, that is, on the lower surface of the module substrate 50 in the direction shown in FIG. 13. The composite device 105 is provided by connecting the terminal electrode 54 to the land of the mother board.

Seventh Preferred Embodiment

A seventh preferred embodiment of the present invention shows an example in which a bonded surface of a surface mount component and a bonded surface of a module substrate are bonded together through a bonding layer of a thermoplastic resin layer.

Figure 14A:
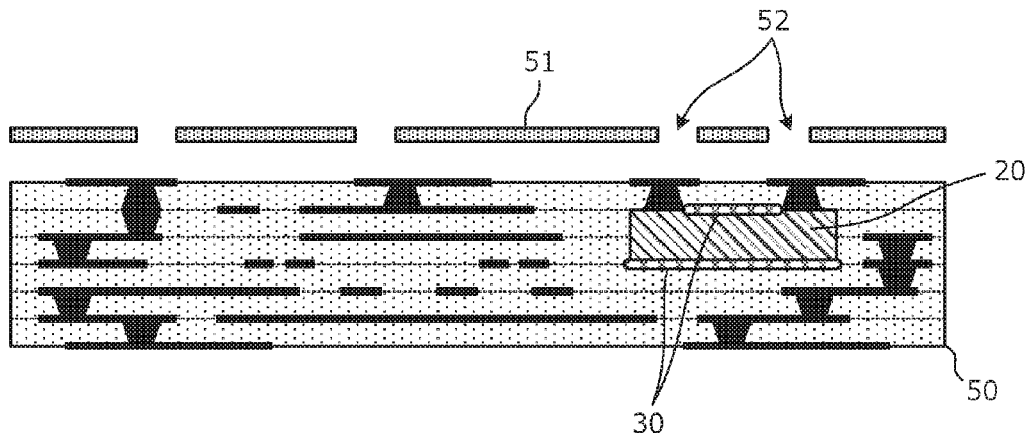
FIGS. 14A-14C is a cross-sectional view showing a composite device according to a seventh preferred embodiment of the present invention.
Figure 14B:
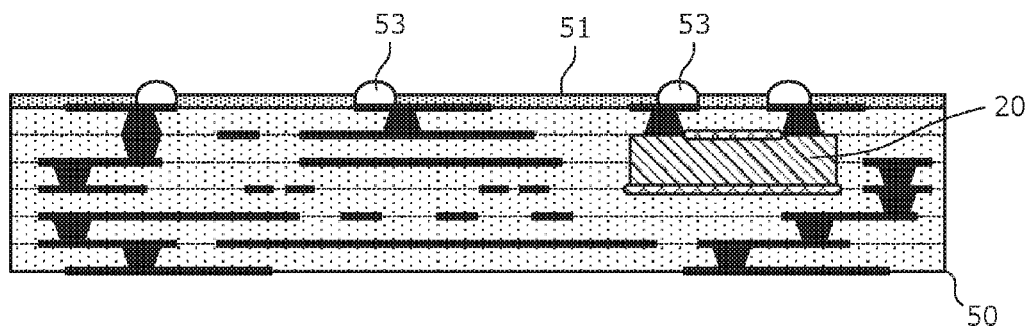
Figure 14C:
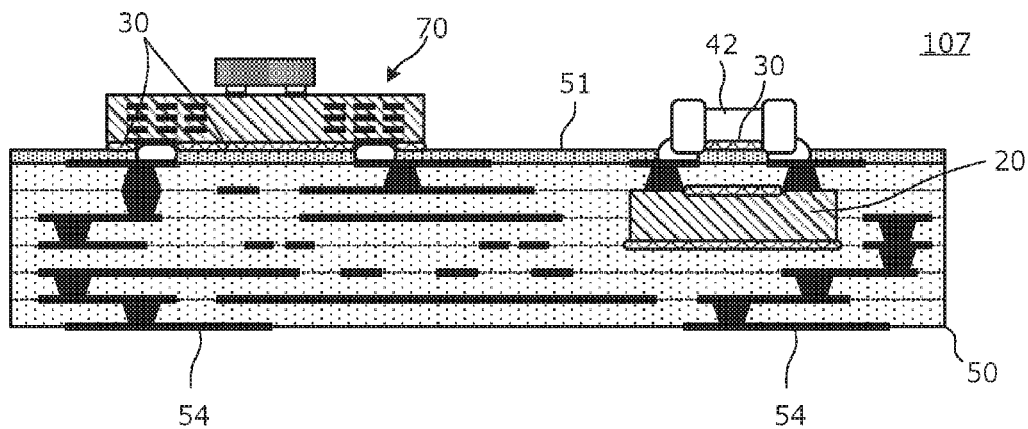

FIGS. 14A-14C are cross-sectional views showing a composite device 107 according to the seventh preferred embodiment. FIGS. 14A and 14B are cross-sectional views each showing a state during manufacturing of the composite device 107. FIG. 14C is a cross-sectional view of the composite device 106 after manufacturing is completed. The mounted component 20 is mounted in the module substrate 50 in the same or a similar arrangement as the fourth preferred embodiment described above.

As shown in FIG. 14A, the thermoplastic resin layer 51 is affixed to the upper surface of the module substrate 50. This thermoplastic resin layer 51 is the same as or similar to the thermoplastic resin layer defining the substrate 50. The thermoplastic resin layer 51 is a polymer with a comparatively low melting point, preferably lower than that of the thermoplastic resin layer defining the substrate 50, for example, and the thickness of the thermoplastic resin layer 51 is, for example, about 20 μm to about 30 μm. The thermoplastic resin layer 51 includes openings 52 at positions at which the conductive bonding materials 53 are to be included. In addition, as shown in FIG. 14B, the conductive bonding materials 53 are provided in the openings 52. The conductive bonding materials 53 preferably include features similar to the conductive bonding material 31 described above with respect to the third and fourth preferred embodiments. Subsequently, as shown in FIG. 14C, surface mount components 70, 42 are mounted and heated. This causes the conductive bonding materials 53 to solidify. In other words, by heating the conductive bonding materials 53 to or above the melting temperature of the low-melting-point metal powder (for example, about 230° C. or more), Sn and Cu—Ni alloy (or Cu—Mn alloy) are reacted with each other to form the intermetallic compound. In addition, the bonding layer 30 is formed in a bonded portion between the lower surface of each of the surface mount components 70, 42 and the thermoplastic resin layer 51.

Accordingly, preferred embodiments of the present invention are able to also be applied to a configuration in which the bonded surface of the surface mount component and the bonded surface of the substrate are bonded together through the bonding layer of the thermoplastic resin layer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite device comprising:
   a substrate; and
   a mounted component mounted to a surface of the substrate; wherein
   the substrate includes a first thermoplastic resin layer;
   at least a surface of the mounted component includes a second thermoplastic resin layer that includes a same or a similar material as that of the first thermoplastic resin layer; and
   a conductive bonded portion including a conductive bonding material is provided between the second thermoplastic resin layer and the first thermoplastic resin layer; and
   a bonding layer that bonds the second thermoplastic resin layer and the first thermoplastic resin layer together is provided between the second thermoplastic resin layer and the first thermoplastic resin layer.

2. The composite device according to claim 1, wherein at least one of the first thermoplastic resin layer and the second thermoplastic resin layer is flexible.

3. The composite device according to claim 1, wherein the mounted component is a component in which an IC chip is on a surface of a base material of the second thermoplastic resin layer.

4. The composite device according to claim 1, wherein the mounted component is a component in which a base material of the second thermoplastic resin layer includes a built-in IC chip.

5. The composite device according to claim 1, wherein the mounted component is a component in which the second thermoplastic resin layer is affixed to a portion of the IC chip.

6. The composite device according to claim 1, wherein the substrate includes a structure in which a plurality of thermoplastic resin layers including the first thermoplastic resin layer are laminated.

7. The composite device according to claim 1, wherein the substrate is a collective substrate including a plurality of child board regions, and the mounted component is an RFIC package and is connected to a portion of a conductive pattern at an edge of the collective substrate.

8. The composite device according to claim 1, wherein between the second thermoplastic resin layer and the first thermoplastic resin layer, all bonding regions other than the conductive bonded portion define the bonding layer.

9. The composite device according to claim 1, wherein the conductive bonded portion is embedded into the substrate.

10. The composite device according to claim 1, wherein the conductive bonding material is a paste that solidifies when subjected to thermal treatment.

11. The composite device according to claim 3, wherein the mounted component includes, around the IC chip, a protective layer comprising a third thermoplastic resin layer that includes a same or a similar material as that of the second thermoplastic resin layer.

12. The composite device according to claim 3, wherein the mounted component includes, around the IC chip, a protective layer comprising a thermosetting resin layer.

13. The composite device according to claim 3, wherein a circuit pattern is located inside the base material.

14. The composite device according to claim 3, wherein the IC chip is mounted on the base material by a conductive bonding material.

15. The composite device according to claim 13, wherein the circuit pattern includes a resonant circuit with a predetermined resonance frequency.

16. The composite device according to claim 7, wherein the RFIC package communicates in a UHF band.

17. The composite device according to claim 7, wherein the plurality of child board regions are arranged in a lattice shape.

18. The composite device according to claim 7, wherein the conductive pattern includes a loop portion.

19. The composite device according to claim 18, wherein the loop portion provides impedance matching between the mounted component and the conductive pattern.

20. The composite device according to claim 10, wherein
   the conductive bonding material includes a metal powder and an alloy powder;
   the alloy powder defines an intermetallic compound with the metal powder.

* * * * *